(12) United States Patent
Li

(10) Patent No.: US 11,916,040 B2
(45) Date of Patent: Feb. 27, 2024

(54) BONDING CAVITY STRUCTURE AND BONDING METHOD

(71) Applicants: SHANGHAI IC R&D CENTER CO., LTD., Shanghai (CN); Shanghai Integrated Circuit Equipment & Materials Industry Innovation Center Co., Ltd., Shanghai (CN)

(72) Inventor: Xinyu Li, Shanghai (CN)

(73) Assignees: Shanghai IC R&D Center Co., Ltd., Shanghai (CN); Shanghai Integrated Circuit Equipment & Materials Industry Innovation Center Co., Ltd, Shanghai (CN)

( * ) Notice: Subject to any disclaimer, the term of this patent is extended or adjusted under 35 U.S.C. 154(b) by 430 days.

(21) Appl. No.: 17/418,816

(22) PCT Filed: Dec. 4, 2019

(86) PCT No.: PCT/CN2019/122975
§ 371 (c)(1),
(2) Date: Jun. 26, 2021

(87) PCT Pub. No.: WO2020/134922
PCT Pub. Date: Jul. 2, 2020

(65) Prior Publication Data
US 2022/0068875 A1 Mar. 3, 2022

(30) Foreign Application Priority Data
Dec. 28, 2018 (CN) .......................... 201811618228.1

(51) Int. Cl.
*H01L 21/18* (2006.01)
*H01L 23/00* (2006.01)

(52) U.S. Cl.
CPC .............. *H01L 24/83* (2013.01); *H01L 24/75* (2013.01); *H01L 2224/75102* (2013.01); *H01L 2224/83894* (2013.01)

(58) Field of Classification Search
CPC ..................... H01L 24/83; H01L 24/75; H01L 2224/75102; H01L 2224/83894;
(Continued)

(56) References Cited

U.S. PATENT DOCUMENTS 10,056,272 B2 * 8/2018 Lin .......................... H01L 24/75
11,521,950 B2 * 12/2022 Kurosawa ............... H01L 24/81
(Continued)

*Primary Examiner* — S M Sohel Imtiaz
(74) *Attorney, Agent, or Firm* — Andrew C. Cheng

(57) ABSTRACT

The present invention discloses a bonding cavity structure and a bonding method, the bonding cavity structure comprises an upper carrier and a lower carrier, a gas-flow forming mechanism, which comprises multiple open-close integrated arms, the integrated arms are provided with multiple nozzles facing to wafer bonding surfaces, and the nozzles are switched to gas nozzles or vacuum suction nozzles, a closed space is formed by all the integrated arms closed together with the carriers, all the nozzle located on a side of two wafers are set as the gas nozzles, which blow gas parallel to the wafer bonding surfaces, meanwhile, all the nozzles located on the other side of the two wafers are set as the vacuum suction nozzles, which suck the gas blown from the gas nozzle at corresponding position, a high-speed gas-flow is generated between the two wafers, so as to produce a low pressure of Bernoulli effect, the wafers are not only subjected to thrust forces from backsides, but tension forces between the bonding surfaces are also affected by uniform low pressure, which enhances force uniformity during bonding process, and reduces an impact of particles on the bonding surfaces in the closed space.

10 Claims, 3 Drawing Sheets

(58) Field of Classification Search
CPC ............. H01L 21/185; H01L 21/67092; H01L 21/6838; H01L 24/08; H01L 24/80; H01L 24/94
See application file for complete search history.

(56) References Cited

U.S. PATENT DOCUMENTS

| | | | |
|---|---|---|---|
| 2007/0272349 A1* | 11/2007 | Chen .................... | H01L 24/83 257/E21.505 |
| 2014/0083617 A1* | 3/2014 | Taga ................... | B32B 37/1009 156/382 |
| 2014/0182761 A1* | 7/2014 | Hayashi ............. | H01L 21/6838 156/60 |
| 2019/0148333 A1* | 5/2019 | Chen .................... | H01L 24/94 438/16 |
| 2019/0393185 A1* | 12/2019 | Tanabe ................... | H01L 24/75 |

\* cited by examiner

=Prior Art=

=Prior Art=

BONDING CAVITY STRUCTURE AND BONDING METHOD

CROSS-REFERENCE TO RELATED APPLICATION

This application claims priority of International Patent Application Serial No. PCT/CN2019/122975, filed Dec. 4, 2019, which is related to and claims priority of Chinese patent application Serial No. 201811618228.1 filed on Dec. 28, 2018. The entirety of each of the above-mentioned patent applications is hereby incorporated herein by reference and made a part of this specification.

TECHNICAL FIELD

The disclosure relates to the technical field of integrated circuit manufacturing technology, in particular to a new type of a bonding cavity structure and a bonding method.

BACKGROUND

Wafer bonding process is currently a special process in integrated circuit manufacturing. Since beginning of bonding process, many different types of wafer bonding methods have been emerged, such as high temperature bonding, vacuum bonding and low temperature bonding. Among them, most advanced technology is direct wafer bonding process under normal temperature and pressure, which is mostly used in an emerging field of 3D stacking technology. The direct wafer bonding process is to combine two polished silicon wafers with special surface pretreatment under normal temperature and pressure, no adhesive is used, and molecular forces between the two wafers is used to bond the wafers together. Surface pretreatments include plasma bombardment and wet etching, etc.

Bonding cavity is a key equipment to realize a wafer bonding process. In the direct bonding process with normal temperature and pressure, generally, structure of a bonding cavity is composed of a upper carrier 1 and a lower carrier 1 set parallel, two wafers 2 are carried respectively to be bonded, vacuum suction forces are provided to carrier surfaces, and two wafers 2 are fixed on the upper carrier 1 and a lower carrier 1 respectively, bonding surfaces of the two upper and lower wafers 2 are set opposite, as shown in FIG. 1.

Generally, a process method of the bonding cavity includes: at beginning of bonding, the upper carrier 1 and the lower carrier 1 are moved toward to a certain distance, by ways of mechanical thimble or gas-flow from centers of carrier surfaces, thrust forces are produced on outward directions at the centers of the backsides of the wafers 2, thus the centers of the upper and lower wafers 2 are contacted, so as to generate initial bonding forces. Immediately the vacuum suction force of the upper carrier 1 is released, the two wafers 2 are gradually bonded from centers to edges under action of bonding forces until the bonding is all completed, as shown in FIG. 2.

Generally, during the bonding process, the wafers are deformed only under the thrust forces generated by backside carriers to achieve bonding, force mode is point contact or line contact, force uniformities on the wafers are poor, especially for a wafer with a certain degree of warpage, it is easy to cause a unexpected displacement during the bonding process, which leads to a result deviation of the bonding process.

In addition, because the bonding cavity is in a normal pressure state, space between the bonded surfaces of the two wafers is in an open atmospheric pressure state, which is uncontrolled due to disturbance of an airflow, thus bonding forces on the wafers are affected. Disturbance of the airflow may also bring particles, which affect cleanliness of the bonding surfaces, and cause voids in the middle of the wafers after bonding, so as to seriously affect yield of bonding productions.

As mentioned above, disadvantages of the existing bonding cavity are: the wafers are bonded by single-sided forces, and the force mode is point contact or line contact, and there is a possibility of uneven forces, such as the wafers to be bonded have a large degree of warpage, the uneven forces aggravate a process deviation during the bonding process. In addition, in the existing bonding cavity, the space between the bonding surfaces of the two wafers to be bonded is uncontrolled, which is greatly affected by the external space, and is easily affected by a gas turbulence in the space, so as to affect the bonding process and have unpredictable particle impacts.

The present invention aims to provide a new bonding cavity structure to solve the above problems.

SUMMARY

In order to achieve the above object, the present invention provides a bonding cavity structure, comprising an upper carrier and a lower carrier, wherein further comprising: a gas-flow forming mechanism, which comprises multiple open-close integrated arms, a closed space is formed between the upper carrier and the lower carrier at bonding positions by all the integrated arms closed together, the integrated arms are provided with multiple nozzles facing to wafer bonding surfaces, and the nozzles are switched to be used as gas nozzles or vacuum suction nozzles; wherein, during closing all the integrated arms, all the nozzles located on a side of two wafers are set as the gas nozzles, which blow gas parallel to the wafer bonding surfaces, meanwhile, all the nozzles located on the other side of the two wafers are set as the vacuum suction nozzles, which suck the gas blown from the gas nozzle at corresponding position, a high-speed gas-flow is generated between the two wafers, so as to produce a low pressure of Bernoulli effect, which generates tension forces on the two wafers for bonding process.

Further, by setting sealing strips, the closed space is formed between the upper carrier and the lower carrier at the bonding positions by all the integrated arms closed together.

Further, the integrated arms are set on a base, and the base is provided with a driving mechanism for driving the base to move linearly along closing directions of the integrated arms.

Further, further comprising: a nozzle integrated module set on the base, the nozzle integrated module comprises gas pipelines and vacuum pipelines connected with each the nozzle by switching valves.

Further, further comprising: a gas flow control system is set in the gas pipelines, which comprise a pneumatic valve, a pressure regulating valve, a signal converter and a gas flow controller.

Further, the integrated arms are provided with an air pressure sensor for detecting pressure changes inside the closed space during the bonding process and supplying real-time feedback to the gas flow control system.

To achieve the above objective, the present invention also provides a bonding method according to the bonding cavity structure of claim 1, comprising:

step S01: picking up the two wafers by a robot arm and placing on the upper carrier and the lower carrier respectively;

step S02: moving all the integrated arms from waiting positions until the closed space is formed by all the integrated arms closed together with the upper carrier and the lower carrier;

step S03: opening the gas nozzles located on the side of the wafers to perform the bonding process, and opening the vacuum nozzles located on the other side of the wafers, a high-speed airflow is generated between the two wafers, so as to produce the low pressure of Bernoulli effect, which generates the tension forces on the two wafers;

step S04: after completing the bonding process, the integrated arms are opened and returned back to the waiting position;

step S05: separating the upper carrier and the lower carrier, and the wafers bonded are taken out by the robot arm.

Further, in step S03, flow rates of the gas nozzles are closed-loop controlled to perform the bonding process, so as to adjust the value of the low pressure in the closed space.

Further, in step S03, during the bonding process, the center positions of the two wafers are contacted and gradually expanded to the surrounding, the gas nozzles and the vacuum nozzles are closed gradually from center to edge until the bonding process is completed.

Further, in step S04, the pressure of the closed space is detected after completing the bonding process and matched with atmospheric pressure, adjusting the pressure of the closed space to be consistent with the atmospheric pressure, and then opening the integrated arms.

From above technology methods, the present invention adopts the gas flow forming mechanism between the bonding surfaces of the wafers, so as to utilize the Bernoulli effect to generate the closed space with constant low pressure, during the bonding process, the wafers are not only subjected to the thrust forces from the backsides, but the tension forces between the bonding surfaces are also affected by the uniform low pressure, which enhances force uniformity during the bonding process, and reduces an impact of particles on the bonding surfaces in the closed space.

Figure 1:
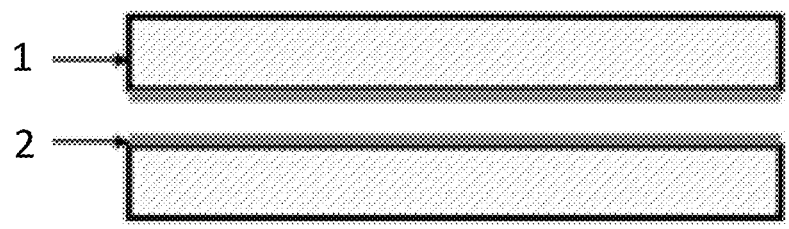
FIG. 1 is a schematic diagram of an existing bonding cavity structure.
Figure 2:
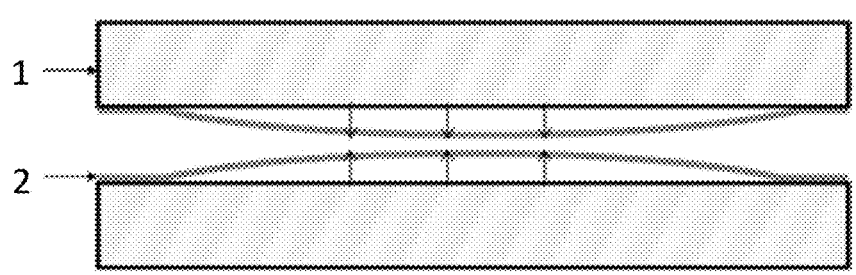
FIG. 2 is a schematic diagram of an existing bonding cavity bonding method.

In the picture: 1. carrier, 2. wafer, 3. robot arm, 4. integrated arm, 5. gas nozzle/gas (nitrogen) nozzle/vacuum nozzle, 6. air pressure sensor, 7. arm joint surface and sealing Article, 8. base, 9. gas flow control system, 10. high-speed gas flow, 11. bernoulli effect low pressure state.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the disclosure. Instead, they are merely examples of apparatuses and methods consistent with aspects related to the disclosure as recited in the appended claims.

It is to be understood that "first", "second" and similar terms used in the specification and claims are not to represent any sequence, number or importance but only to distinguish different parts. Likewise, similar terms such as "a" or "an" also do not represent a number limit but represent "at least one". It is also to be understood that term "and/or" used in the present disclosure refers to and includes one or any or all possible combinations of multiple associated items that are listed.

In a following specific embodiment of the present invention, please refer to FIG. 3 to FIG. 6, which are schematic diagrams of a bonding cavity structure according to a preferred embodiment of the present invention. As shown in FIG. 3 to FIG. 6, the bonding cavity structure of the present invention comprises an upper carrier 1 and a lower carrier 1, and further comprises: a gas-flow forming mechanism, which comprises multiple open-close integrated arms 4, a closed space is formed between the upper carrier 1 and the lower carrier 1 at bonding positions by all the integrated arms 4 closed together, the integrated arms 4 are provided with multiple nozzles 5 facing to wafer bonding surfaces, and the nozzles 5 are switched to gas nozzles 5 or vacuum suction nozzles 5; wherein, during closing all the integrated arms 4, all the nozzles 5 located on a side (beside right or left side) of two wafers 2 are set as the gas nozzles 5, which blow gas parallel to the wafer bonding surfaces, meanwhile, all the nozzles 5 located on the other side (beside left or right side) of the wafers 2 are set as the vacuum suction nozzles 5, which suck the gas blown from the gas nozzle 5 at corresponding position, a high-speed gas-flow is generated between the two wafers 2, so as to produce a low pressure of Bernoulli effect, which generates tension forces on the two wafers 2 for bonding process.

Based on an ordinary bonding cavity structure, the present invention adds the gas-flow forming mechanism and a gas flow control system 9, and a gas adopted is process ultra-pure nitrogen. The present invention comprises the nozzles 5, which can be switched to nitrogen nozzles 5 or vacuum suction nozzles 5, the open-close integrated arms 4 (comprising sealing strips 7), an air pressure sensor 6, a base 8 and a gas flow control system 9 set in the base 8, etc.

A plurality of the nitrogen nozzles 5 are set to generate nitrogen gas with high-speed flow, according to a Bernoulli principle of a fast gas flow with low pressure, a uniform low pressure is generated between the two wafers 2, which is similar to generating a "pull force" between the two wafers 2, so as to better provide auxiliary forces to the bonding process.

The number of the vacuum suction nozzles 5 can be corresponding to the nitrogen nozzles 5, which is used to cooperate with the nitrogen nozzles 5 to take away the nitrogen gas generated by the nitrogen nozzles 5, so as to maintain a continuous and stable low-pressure space. The vacuum suction nozzle 5 and the nitrogen nozzle 5 can be integrated on same nozzle 5, that is, the nozzles 5 are both the nitrogen nozzles 5 and the vacuum suction nozzles 5, which are added switching valves to nitrogen pipelines and vacuum pipelines of a gas nozzle module, so as to realize switching of the nitrogen pipelines and the vacuum pipelines. Advantage is the nozzles 5 located in different positions can be arbitrarily switched to the nitrogen nozzles 5 or the vacuum suction nozzles 5 as needed to realize process flexibility.

Figure 3:
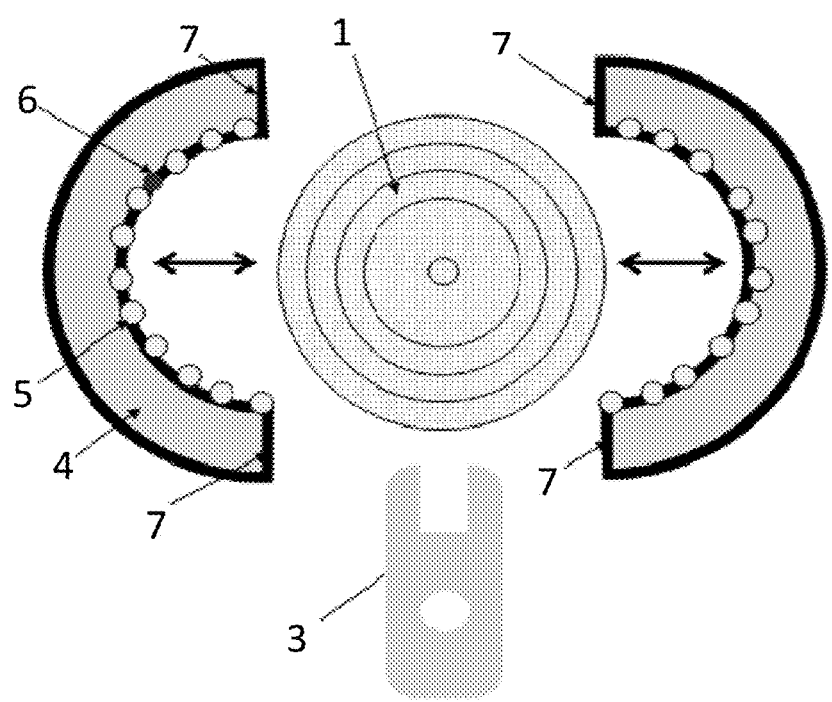
FIG. 3 to FIG. 6 are schematic diagrams of a bonding cavity structure according to a preferred embodiment of the present invention.
Figure 4:
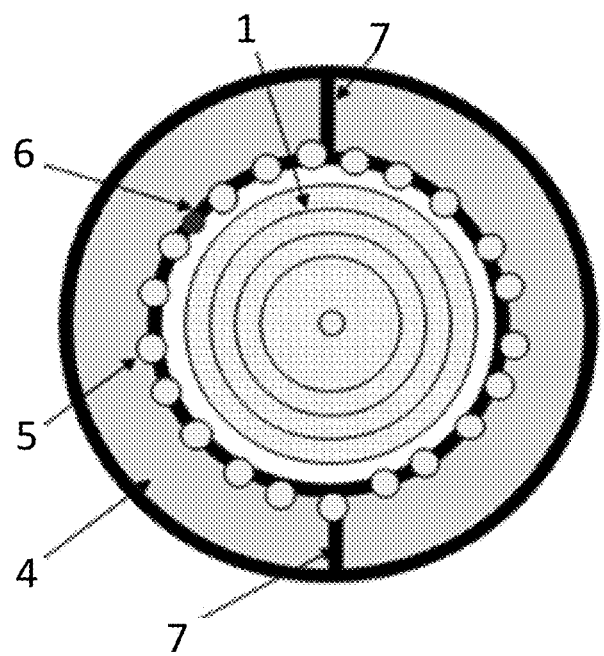
Figure 5:
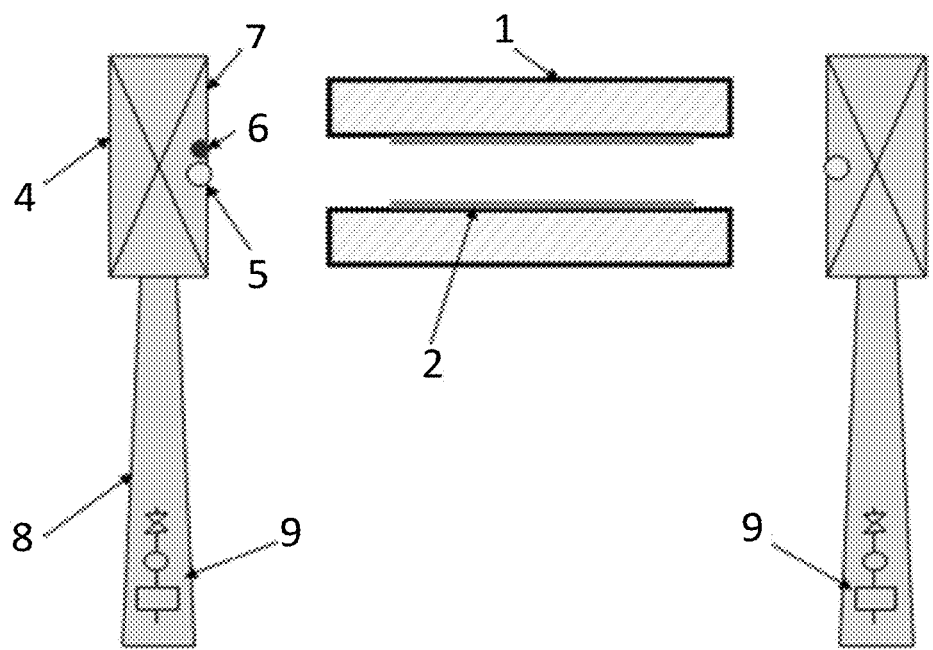
Figure 6:
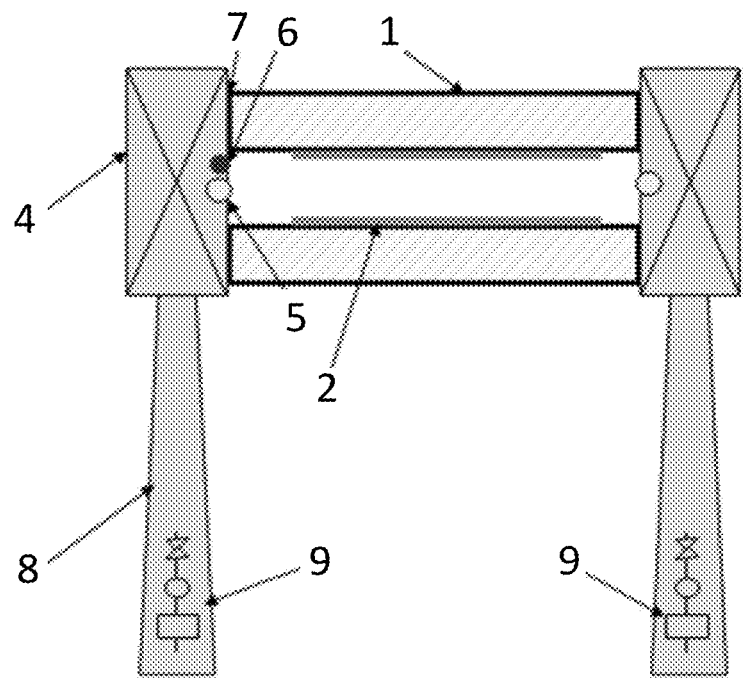

The function of the open-close nozzle integrated arms 4 are used to fix and integrate the nitrogen nozzles 5 and the vacuum suction nozzles 5, so as to adjust nozzle angles to adapt to change in the bonding process. Two integrated arms 4 are set oppositely, before starting the bonding process, the two integrated arms 4 are in separated state, so as to provide an area for a robot arm 3 to enter and exit to grab the wafers 2, as shown in FIG. 3 and FIG. 5. At beginning of the bonding process, the integrated arms 4 are closed to the carriers 1 of the wafers 2 to form a complete structure, the sealing strips 7 are used to seal and formed a closed space, as shown in FIG. 4 and FIG. 6. The size and the shape of the integrated arms depend on specifications of the carriers 1 of the wafers 2.

Function of the gas flow control system 9 is mainly to automatically control flow of the nitrogen gas generated by the nozzles, so as to adjust the low pressure of the closed space. The air pressure sensor 6 is cooperated with the gas flow control system 9 to detect gas pressure in the closed space and feed back to the gas flow control system 9, so as to determine whether it is necessary to automatically adjust the flow of the nitrogen gas.

Distributions of the nitrogen nozzles 5 and the vacuum nozzles 5 can be set to evenly along integrated surfaces of the nozzles and parallel to bonding surfaces of the wafers 2, thus gas can evenly flow through the wafers 2 and cover the entire surfaces of the wafers 2, as shown in FIG. 3. Sizes of the nozzles are generally no more than 5 mm, and a certain distance is kept between two gas nozzles. Materials of the nozzles can be plastics, stainless steels or other dust-free materials.

The two nozzle integrated arms 4 should be of same size and set oppositely. Each the integrated arm 4 comprises a base 8 moved linearly and the nozzle integrated module. The base 8 can be driven by a cylinder or a motor, and the nozzle integrated module is fixed on the base 8. Both necessary nitrogen pipelines and necessary vacuum pipelines are integrated inside the integrated arms, and only the nozzles are exposed outside. Positions of the integrated arms 4 can comprise an initial position, a waiting position, a process position, etc., and position sensors and limit switches are provided. Sealing rings are set on joint surfaces 7 between the integrated arms 4, and areas of the closed spaced sealed by the sealing rings should be corresponding to spacing between the wafers 2 during the bonding process. Before and after the bonding process, the integrated arms 4 are located in the waiting position, which can be regarded as in an open state, and the front and back of the carriers 1 are not blocked, which is convenient for the robot arm 3 to enter and exit to grab the wafers 2. When the wafers 2 are placed on the carriers 1 and ready to start the bonding process, the two integrated arms 4 move relative respectively until contacted together and a bonding space is completely sealed by combinations of the integrated arms.

The gas flow control system 9 can be installed in the nitrogen pipelines, comprising but not limited to nitrogen gas pipelines, pneumatic valves, pressure regulating valves, signal converters, gas flow controllers, etc. Specifically, a gas pressure sensor 6 is located on the integrated arms 4 with gas nozzles, a sensor probe is located on the joint surfaces 7 of the integrated arm 4, which can be directly used to detect pressure change inside the bonding space and feed back to the gas flow control system 9 in time.

Hereinafter, a bonding method of the present invention is described in detail with reference to specific embodiments and FIG. 3 to FIG. 7.

The bonding method of the present invention can use the above-mentioned bonding cavity structure and comprise following steps:

Step S01: picking up the two wafers 2 by a robot arm 3 and placing on the upper carrier 1 and the lower carrier 1 respectively.

Step S02: moving all the integrated arms 4 from waiting positions until the closed space is formed by all the integrated arms 4 closed together with the upper carrier 1 and the lower carrier 1.

Before starting the bonding process, the two integrated arms 4 are moved to include the carriers 1 and wafer 2, thus forming the closed space.

Step S03: opening the gas nozzles 5 located on the side (beside right or left side) of the wafers 2 to perform the bonding process, and opening the vacuum nozzles 5 located on the other side (beside left or right side) of the wafers 2, a high-speed airflow is generated between the two wafers 2, so as to produce the low pressure of Bernoulli effect, which generates the tension forces on the two wafers 2.

When starting the bonding process, flow rate of each the nozzle 5 is closed-loop controlled, so as to adjust the value of the low pressure in the closed space.

Figure 7:
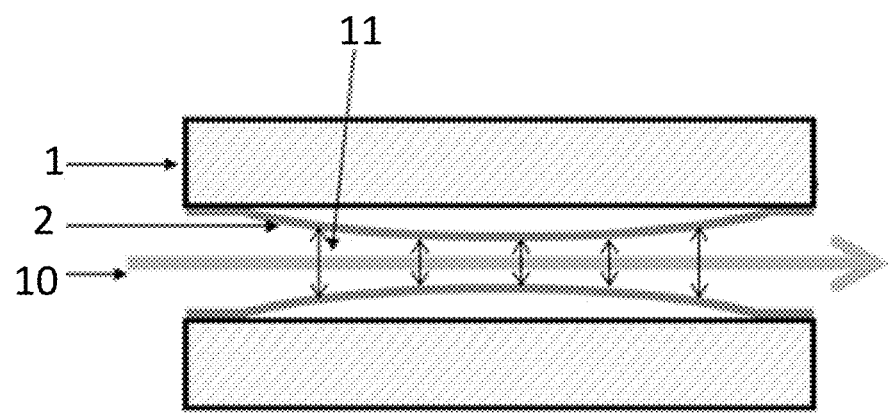
FIG. 7 is a schematic diagram of a low pressure of Bernoulli effect and forces generated during a bonding process of the present invention.

When starting the bonding process, the backsides of the wafers 2 are deformed by thrust forces generated by the carriers 1. Meanwhile, the nitrogen nozzles 5 on a side (beside right or left side) are opened, and the nozzles at corresponding positions on the other side (beside left or right side) are switched to be used as the vacuum nozzles 5, a stable high-speed gas flow 10 is generated in the closed space between the two wafers 2, so as to produce a low pressure 11 of Bernoulli effect (as indicated by an arrow), the closed space is kept in low-pressure state, thus the tension forces with continuous low-pressure are produced on the bonding surfaces of the wafers 2, which produce auxiliary forces to deformations of the wafers 2 during the bonding process, as shown in FIG. 7.

As the bonding process is performed, the center positions of the two wafers 2 are contacted and gradually expanded to the surrounding, with advance of the bonding progress, the nitrogen nozzles 5 and the corresponding vacuum nozzles 5 are gradually closed from center to edge until the bonding process is completed and all of the nozzles are closed.

Step S04: after completing the bonding process, the integrated arms 4 are opened and returned back to the waiting position.

When the bonding process is completed, the air pressure sensor 6 are used to sense and detect pressure of the closed space, which is matched with atmospheric pressure; if the pressure of the closed space is lower than a certain percentage of atmospheric pressure, the nitrogen nozzles 5 or the vacuum nozzles 5 are opened, the pressure of the closed space is adjusted to be consistent with the atmospheric pressure, and then the integrated arms 4 are opened.

step S05: separating the upper carrier 1 and the lower carrier 1, the wafers 2 bonded are taken out by the robot arm 3.

After the joint surfaces 7 of the integrated arms 4 are opened, the two integrated arms 4 are returned to the waiting positions, the upper carrier 1 and the lower carrier 1 are separated, and the bonded wafers 2 are taken out by the robot arm 3.

The description of the present invention is only a preferred example. There are no restrictions on number, shape, size and distribution position of the gas nozzles, number, shape and size of the arms, type of gas flow controllers and the air pressure sensors 6, size of the carrier 1 for the wafer 2 and type of the wafer 2 applicable, etc., any modification, equivalent replacement, improvement, etc., made within the spirit and principle of the present invention shall be included in the protection scope of the present invention. A person having ordinary skill in the art (PHOSITA) should understand.

To sum up, the present invention adopts the air flow forming mechanism between the bonding surfaces of the wafer 2, so as to utilize the Bernoulli effect to generate a constant low pressure, during the bonding process, the wafers 2 are not only subjected to the thrust forces from the backsides, but the tension forces between the bonding surfaces are also affected by the uniform low pressure, which enhances force uniformity during the bonding process, and reduces an impact of particles on the bonding surfaces in the closed space.

It will be appreciated that the disclosure is not limited to the exact construction that has been described above and illustrated in the accompanying drawings, and that various modifications and changes can be made without departing from the scope thereof. It is intended that the scope of the disclosure only be limited by the appended claims.

What is claimed is:

1. A bonding cavity structure, comprising an upper carrier and a lower carrier, wherein further comprising: a gas-flow forming mechanism, which comprises multiple open-close integrated arms, a closed space is formed between the upper carrier and the lower carrier at bonding positions by all the integrated arms closed together, the integrated arms are provided with multiple nozzles facing to wafer bonding surfaces, and the nozzles are switched to be used as gas nozzles or vacuum suction nozzles; wherein, during closing all the integrated arms, all the nozzles located on a side of two wafers are set as the gas nozzles, which blow gas parallel to the wafer bonding surfaces, meanwhile, all the nozzles located on the other side of the two wafers are set as the vacuum suction nozzles, which suck the gas blown from the gas nozzle at corresponding position, a high-speed gas-flow is generated between the two wafers, so as to produce a low pressure of Bernoulli effect, which generates tension forces on the two wafers for bonding process.

2. The bonding cavity structure of claim 1, wherein, by setting sealing strips, the closed space is formed between the upper carrier and the lower carrier at the bonding positions by all the integrated arms closed together.

3. The bonding cavity structure of claim 1, wherein the integrated arms are set on a base, and the base is provided with a driving mechanism for driving the base to move linearly along closing directions of the integrated arms.

4. The bonding cavity structure of claim 3, further comprising: a nozzle integrated module set on the base, the nozzle integrated module comprises gas pipelines and vacuum pipelines connected with each nozzle by switching valves.

5. The bonding cavity structure of claim 4, further comprising: a gas flow control system is set in the gas pipelines, which comprises a pneumatic valve, a pressure regulating valve, a signal converter and a gas flow controller.

6. The bonding cavity structure of claim 5, wherein the integrated arms are provided with an air pressure sensor for detecting pressure changes inside the closed space during the bonding process and supplying real-time feedback to the gas flow control system.

7. A bonding method according to the bonding cavity structure of claim 1, comprising:
    step S01: picking up the two wafers by a robot arm and placing on the upper carrier and the lower carrier respectively;
    step S02: moving all the integrated arms from waiting positions until the closed space is formed by all the integrated arms closed together with the upper carrier and the lower carrier;
    step S03: opening the gas nozzles located on the side of the wafers to perform the bonding process, and opening the vacuum nozzles located on the other side of the wafers, a high-speed airflow is generated between the two wafers, so as to produce the low pressure of Bernoulli effect, which generates the tension forces on the two wafers;
    step S04: after completing the bonding process, the integrated arms are opened and returned back to the waiting position;
    step S05: separating the upper carrier and the lower carrier, and the wafers bonded are taken out by the robot arm.

8. The bonding method of claim 7, wherein in step S03, flow rates of the gas nozzles are closed-loop controlled to perform the bonding process, so as to adjust the value of the low pressure in the closed space.

9. The bonding method of claim 7, wherein in step S03, during the bonding process, the center positions of the two wafers are contacted and gradually expanded to the surrounding, the gas nozzles and the vacuum nozzles are closed gradually from center to edge until the bonding process is completed.

10. The bonding method of claim 7, wherein in step S04, the pressure of the closed space is detected after completing the bonding process and matched with atmospheric pressure, adjusting the pressure of the closed space to be consistent with the atmospheric pressure, and then opening the integrated arms.

* * * * *